United States Patent
Makino et al.

(10) Patent No.: US 9,112,355 B2
(45) Date of Patent: *Aug. 18, 2015

(54) POWER SUPPLY DEVICE, OPERATION METHOD OF POWER SUPPLY DEVICE, ELECTRONIC APPARATUS, AND OPERATION METHOD OF ELECTRONIC APPARATUS

(71) Applicant: Sony Corporation, Tokyo (JP)

(72) Inventors: Eiji Makino, Kanagawa (JP); Youji Sakioka, Kanagawa (JP); Shizunorl Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/243,531

(22) Filed: Apr. 2, 2014

(65) Prior Publication Data

US 2014/0210274 A1    Jul. 31, 2014

Related U.S. Application Data

(63) Continuation of application No. 12/082,874, filed on Apr. 15, 2008, now Pat. No. 8,716,895.

(30) Foreign Application Priority Data

May 17, 2007    (JP) ................................ 2007-132095

(51) Int. Cl.
  *H02J 1/00*    (2006.01)
  *H02J 4/00*    (2006.01)
  (Continued)

(52) U.S. Cl.
  CPC ... *H02J 4/00* (2013.01); *G03B 7/26* (2013.01); *H01L 27/14609* (2013.01);
  (Continued)

(58) Field of Classification Search
  CPC ........................................................ H02J 4/00
  USPC .......... 307/25, 28, 29, 72–75, 80, 81, 85–87, 307/115, 125, 130, 131, 140; 363/142; 327/427, 436, 487, 547
  See application file for complete search history.

(56) References Cited

U.S. PATENT DOCUMENTS 4,700,125 A    10/1987    Takata et al.
5,055,705 A    10/1991    Hall
(Continued)

FOREIGN PATENT DOCUMENTS

JP    2002-077730    3/2002

*Primary Examiner* — Fritz M Fleming
(74) *Attorney, Agent, or Firm* — Robert J. Depke; The Chicago Technology Law Group, LLC

(57) ABSTRACT

A power supply device that switches one of a first power supply, a second power supply, and a third power supply, all of which supply power to an auxiliary device, to a transfer gate in a CMOS image sensor having a photodiode and outputs the corresponding power to the transfer gate is disclosed. The device includes: a first transistor driven by the second power supply and outputting power of the second power supply to the transfer gate; a second transistor driven by the second power supply and outputting power of the first power supply to the transfer gate; a third transistor driven by the third power supply and outputting power of the third power supply to the transfer gate; and a fourth transistor located before the second transistor, driven by the first power supply, and outputting power of the first power supply to a source of the second transistor.

2 Claims, 7 Drawing Sheets

(51) Int. Cl.
*G03B 7/26* (2006.01)
*H01L 27/146* (2006.01)
*H04N 3/14* (2006.01)
*H04N 5/335* (2011.01)
*H04N 5/359* (2011.01)
*H04N 5/369* (2011.01)
*H04N 5/374* (2011.01)

(52) U.S. Cl.
CPC ............ *H04N 3/1568* (2013.01); *H04N 5/335* (2013.01); *H04N 5/3597* (2013.01); *H04N 5/3698* (2013.01); *H04N 5/374* (2013.01)

(56) References Cited

U.S. PATENT DOCUMENTS

| | | | |
|---|---|---|---|
| 5,966,043 A * | 10/1999 | Jinbo | 327/530 |
| 6,529,414 B2 | 3/2003 | Atsumi et al. | |
| 8,716,895 B2 * | 5/2014 | Makino et al. | 307/80 |
| 2002/0054390 A1 | 5/2002 | Koizumi et al. | |
| 2003/0184538 A1 | 10/2003 | Yamato et al. | |

* cited by examiner

POWER SUPPLY DEVICE, OPERATION METHOD OF POWER SUPPLY DEVICE, ELECTRONIC APPARATUS, AND OPERATION METHOD OF ELECTRONIC APPARATUS

CROSS REFERENCES TO RELATED APPLICATIONS

The subject matter of application Ser. No. 12/082,874 is incorporated herein by reference. The present application is a Continuation of U.S. Ser. No. 12/082,874, filed Apr. 15, 2008, which claims priority to Japanese Patent Application JP 2007-132095 filed in the Japanese Patent Office on May 17, 2007, the entire contents of which being incorporated herein by reference.

BACKGROUND OF THE INVENTION

1. Field of the Invention

The present invention relates to a power supply device and an operation method of a power supply device, and in particular, to a power supply device, an operation method of a power supply device, an electronic apparatus, and an operation method of an electronic apparatus capable of efficiently reducing the power consumption of a plurality of power supplies with different voltages and of setting a starting sequence freely.

2. Description of the Related Art

In general, an imaging apparatus using a CMOS (complementary metal oxide semiconductor) sensor configured to include a photodiode and an MOS (metal oxide semiconductor) transistor is widespread.

The CMOS sensor includes a photodiode, a MOS transistor, and an amplifying circuit for amplifying a signal from a photodiode for every pixel and has many advantages that, for example, "XY addressing" or "packaging a sensor and a signal processing circuit in one chip" is possible. However, since the number of elements within one pixel is large, it has been difficult so far to reduce the chip size that determines the size of an optical system. In recent years, however, the CMOS sensor has been drawing attention as a technique of making a MOS transistor small is improved and a request of "packaging a sensor and a signal processing circuit in one chip" or "reducing the power consumption" is increased.

An operation principle of the CMOS sensor is that electric charges generated by photoelectrically converting light, which is received by a photodiode, are transferred through a transfer transistor in the unit of each pixel and are sequentially output at timing designated according to the pixel position. Moreover, an image is generated corresponding to the electric charges output in the unit of a pixel.

Here, when electric charges photoelectrically converted by the transfer transistor in the photodiode are transferred, the transfer of electric charges is controlled by a voltage applied to a gate of the transfer transistor. However, a potential pocket or a barrier is generated if the voltage applied to the gate is simply controlled in two values, and accordingly, the transfer becomes incomplete since the potential of the potential pocket is not flat and residual electric charges are generated. As a result, there has been a possibility that an afterimage or a random noise resulting from the back flow to the photodiode would be generated.

For this reason, there has been proposed a technique of suppressing an afterimage or a random noise by reducing residual electric charges by generating an intermediate electric potential for a predetermined period of time or more in order to make a control with a voltage having at least three values.

An example of the related art includes Japanese Patent No. 3667214.

SUMMARY OF THE INVENTION

As an output driver that outputs a voltage, which has three values, applied to the gate of the transfer transistor described above, an output driver having a configuration as shown in FIG. 1 is considered, for example.

In a three-value output driver 1 shown in FIG. 1, a source of a p-channel MOS transistor (hereinafter, simply referred to as a p-type transistor) Tr1 is connected to a high-voltage power supply $V_H$. When an input voltage of a gate changes to a Low signal, the p-type transistor Tr1 is turned on to output a signal from a drain to an output terminal Vout. Moreover, when the high-voltage power $V_H$ is applied to a back gate and a voltage applied to the gate is the voltage $V_H$, the p-type transistor Tr1 recognizes the voltage as a Hi signal. When the voltage applied to the gate is 0, the p-type transistor Tr1 recognizes the voltage as a Low signal. That is, the p-type transistor Tr1 functions as an output switch of the high-voltage power supply $V_H$.

In addition, a source of a p-type transistor Tr2 is connected to an intermediate-voltage power supply $V_M$ having an intermediate potential between low-voltage power $V_L$ and the high-voltage power $V_H$. When an input voltage of the gate changes to a Low signal, the p-type transistor Tr2 is turned on to output the signal from a drain to the output terminal Vout. Moreover, when the high-voltage power $V_H$ is applied to a back gate and when a voltage applied to the gate is the voltage $V_H$, the p-type transistor Tr2 recognizes the voltage as a Hi signal. When the voltage applied to the gate is 0, the p-type transistor Tr2 recognizes the voltage as a Low signal. That is, the p-type transistor Tr2 functions as an output switch of the intermediate-voltage power supply $V_M$.

Furthermore, a source of an n-channel MOS transistor (hereinafter, simply referred to as an n-type transistor) Tr3 is connected to a low-voltage power supply $V_L$. When an input voltage of a gate changes to a Hi signal, the n-type transistor Tr3 is turned on, such that the signal is output from a drain to the output terminal Vout. Moreover, when the low-voltage power $V_L$ is applied to a back gate and a voltage applied to the gate is 0, the n-type transistor Tr3 recognizes the voltage as a Hi signal. When the voltage applied to the gate is the voltage $V_H$, the n-type transistor Tr3 recognizes the voltage as a Low signal. That is, the n-type transistor Tr3 functions as an output switch of the low-voltage power supply $V_L$.

As described above, an ON/OFF control of the p-type transistors Tr1 and Tr2 and the n-type transistor Tr3 is made. Thus, the high-voltage power $V_H$ is output when accumulating electric charges photoelectrically converted in a photodiode, and the intermediate-voltage power $V_M$ is output for only a predetermined period of time and the low-voltage power $V_L$ is output when transferring the electric charges photoelectrically converted in the photodiode.

In general, the high-voltage power supply $V_H$ is used commonly with an operation power supply of a photodiode, and the intermediate-voltage power $V_M$ is used commonly with an operation power supply of an auxiliary device including a signal processing unit, for example.

In the case when a CMOS sensor is mounted in a portable device in recent years, in order to reduce the power consumption, the high-voltage power $V_H$ that is a power supply of a photodiode whose power consumption is large is controlled to stop at timing, at which imaging is not performed between imaging operations, even during a short period of time. However, even in this state, it may be requested to receive the power of the intermediate-voltage power supply $V_M$ in order to operate the signal processing unit and the like.

In this case, if supply of power from the high-voltage power supply $V_H$ is stopped and supply of power from the intermediate-voltage power supply $V_M$ is continued, the intermediate-voltage power $V_M$ is applied to the source of the p-type transistor Tr2 shown in FIG. 1 even though a voltage applied to the back gate becomes zero. Accordingly, there has been a possibility that a leakage current in the direction from the source to the back gate will be generated.

In addition, in order to use the intermediate-voltage power supply $V_M$ by taking such leakage current into consideration, it is required to necessarily run the high-voltage power supply $V_H$ that does not necessarily need to be supplied with power. As a result, since unnecessary power consumption occurs or there occurs a limitation in a starting sequence of power supplies with three values, it has been difficult to set a starting sequence freely.

Therefore, in view of the above, it is desirable to efficiently reduce the power consumption of a plurality of power supplies with different voltages and to make it possible to set a starting sequence freely.

An embodiment of the present invention provides a power supply device and an electronic apparatus that switch one of a first power supply, a second power supply having a higher potential than the first power supply, and a third power supply having a lower voltage than the first power supply, all of which supply power to an auxiliary device, to a transfer gate in a CMOS image sensor having a photodiode and output the corresponding power to the transfer gate. The power supply device and the electronic apparatus include: a first transistor that is driven by the second power supply and outputs power of the second power supply to the transfer gate; a second transistor that is driven by the second power supply and outputs power of the first power supply to the transfer gate; a third transistor that is driven by the third power supply and outputs power of the third power supply to the transfer gate; and a fourth transistor that is located before the second transistor, is driven by the first power supply, and outputs power of the first power supply to a source of the second transistor. The fourth transistor stops outputting the power of the first power supply to the source of the second transistor when supply of the power of the second power supply is stopped.

It may be possible to further include a signal generating section generating a predetermined signal when supply of the power of the second power supply is stopped, and the fourth transistor may stop outputting the power of the first power supply to the source of the second transistor on the basis of the predetermined signal when supply of the power of the second power supply is stopped.

Another embodiment of the present invention provides an operation method of a power supply device that switches one of a first power supply, a second power supply having a higher potential than the first power supply, and a third power supply having a lower voltage than the first voltage, all of which supply power to an auxiliary device, to a transfer gate in a CMOS image sensor having a photodiode and outputs the corresponding power to the transfer gate. The operation method includes a first transistor that is driven by the second power supply and outputs power of the second power supply to the transfer gate, a second transistor that is driven by the second power supply and outputs power of the first power supply to the transfer gate, a third transistor that is driven by the third power supply and outputs power of the third power supply to the transfer gate, and a fourth transistor that is located before the second transistor, is driven by the first power supply, and outputs power of the first power supply to a source of the second transistor and includes the step of causing the fourth transistor to stop outputting the power of the first power supply to the source of the second transistor when supply of the power of the second power supply is stopped.

According to the embodiments of the present invention, it becomes possible to efficiently reduce the power consumption of a plurality of power supplies with different voltages and to set the starting sequence freely.

DESCRIPTION OF THE PREFERRED EMBODIMENTS

Hereinafter, embodiments of the present invention will be described. The correspondence relationship between configuration requirements of the present invention and embodiments described in this specification or drawings is as follows. This description is made to confirm that embodiments supporting the present invention are described in this specification or drawings. Therefore, even if there exists an embodiment that is described in this specification or drawings but not described herein as what corresponds to the configuration requirements of the present invention, the embodiment is not to be interpreted as an embodiment which does not correspond to the configuration requirements. In contrast, even if an embodiment is described herein as what corresponds to the configuration requirements, the embodiment is not to be interpreted as an embodiment which does not correspond to a configuration requirement other than the configuration requirements.

Moreover, this description does not mean all the inventions described in this specification. In other words, this description does not deny existence of the invention that is described in this specification but is not claimed in this application, that is, existence of the invention that will appear and be added by divisional application or correction in the future.

Figure 1:
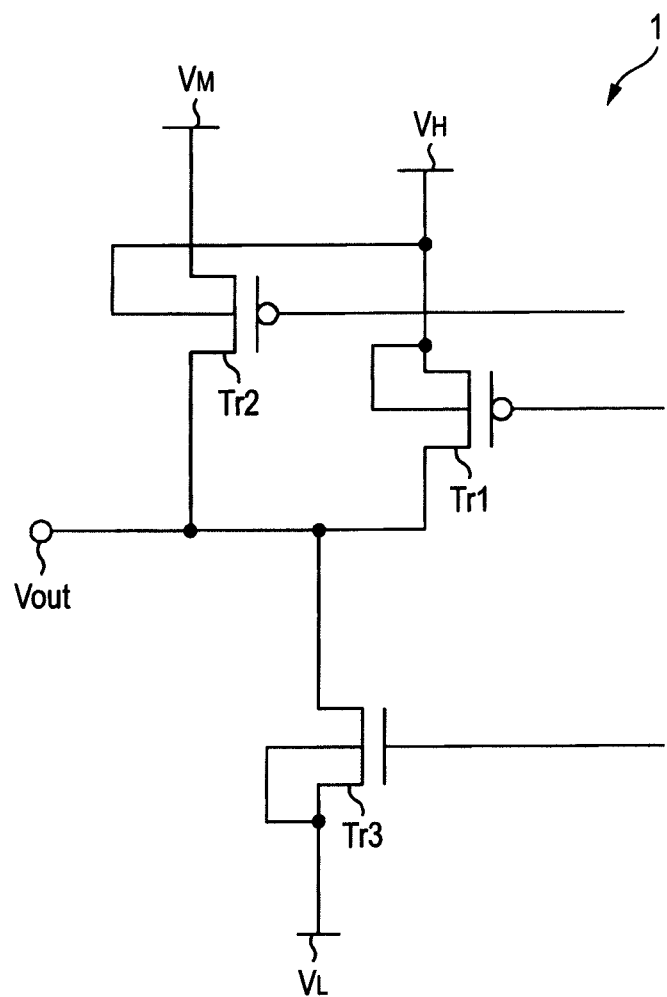
FIG. 1 is a block diagram illustrating an example of the configuration of a three-value output driver in the related art.
Figure 2:
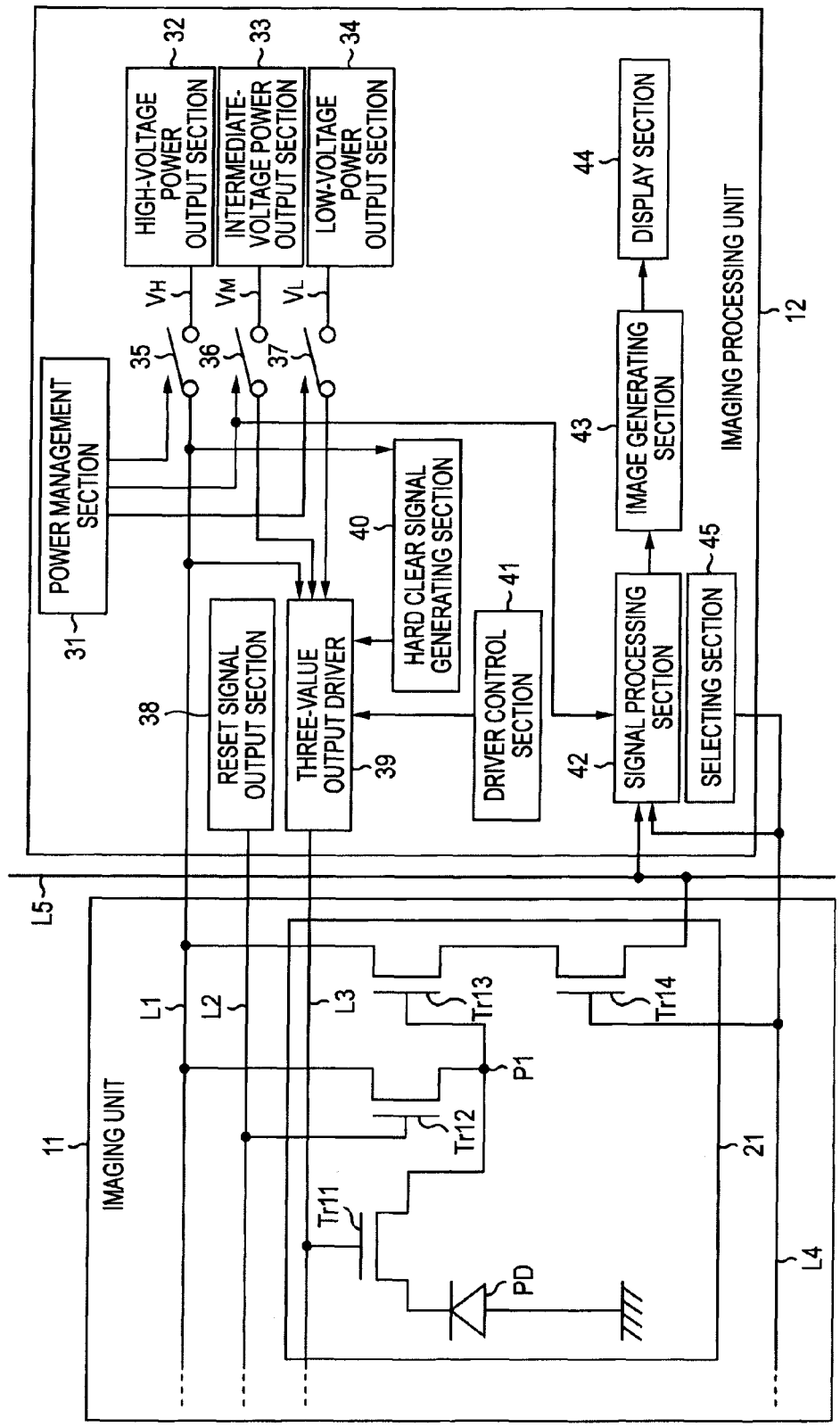
FIG. 2 is a block diagram illustrating an example of the configuration of an imaging apparatus to which the present invention is applied.

That is, a power supply device and an electronic apparatus according to an embodiment of the present invention are a power supply device (for example, a three-value output driver 39 shown in FIG. 2) and an electronic apparatus that switch one of a first power supply (for example, an intermediate-voltage power output section 33 shown in FIG. 2), a second power supply (for example, a high-voltage power output section 32 shown in FIG. 2) having a higher potential than the first power supply, and a third power supply (for example, a low-voltage power output section 34 shown in FIG. 2) having a lower voltage than the first power supply, all of which supply power to an auxiliary device, to a transfer gate (for example, a gate terminal of a transistor Tr11 shown in FIG. 2) in a CMOS image sensor having a photodiode and output the corresponding power to the transfer gate. The power supply device and the electronic apparatus according to the embodiment of the present invention include: a first transistor (for example, a p-type transistor Tr22 shown in FIG. 3) that is driven by the second power supply and outputs power of the second power supply to the transfer gate; a second transistor (for example, a p-type transistor Tr21 shown in FIG. 3) that is driven by the second power supply and outputs power of the first power supply to the transfer gate; a third transistor (for example, an n-type transistor Tr23 shown in FIG. 3) that is driven by the third power supply and outputs power of the third power supply to the transfer gate; and a fourth transistor (for example, a p-type transistor Tr31 shown in FIG. 3) that is located before the second transistor, is driven by the first power supply, and outputs power of the first power supply to a source of the second transistor. The fourth transistor stops outputting the power of the first power supply to the source of the second transistor when supply of the power of the second power supply is stopped.

Figure 3:
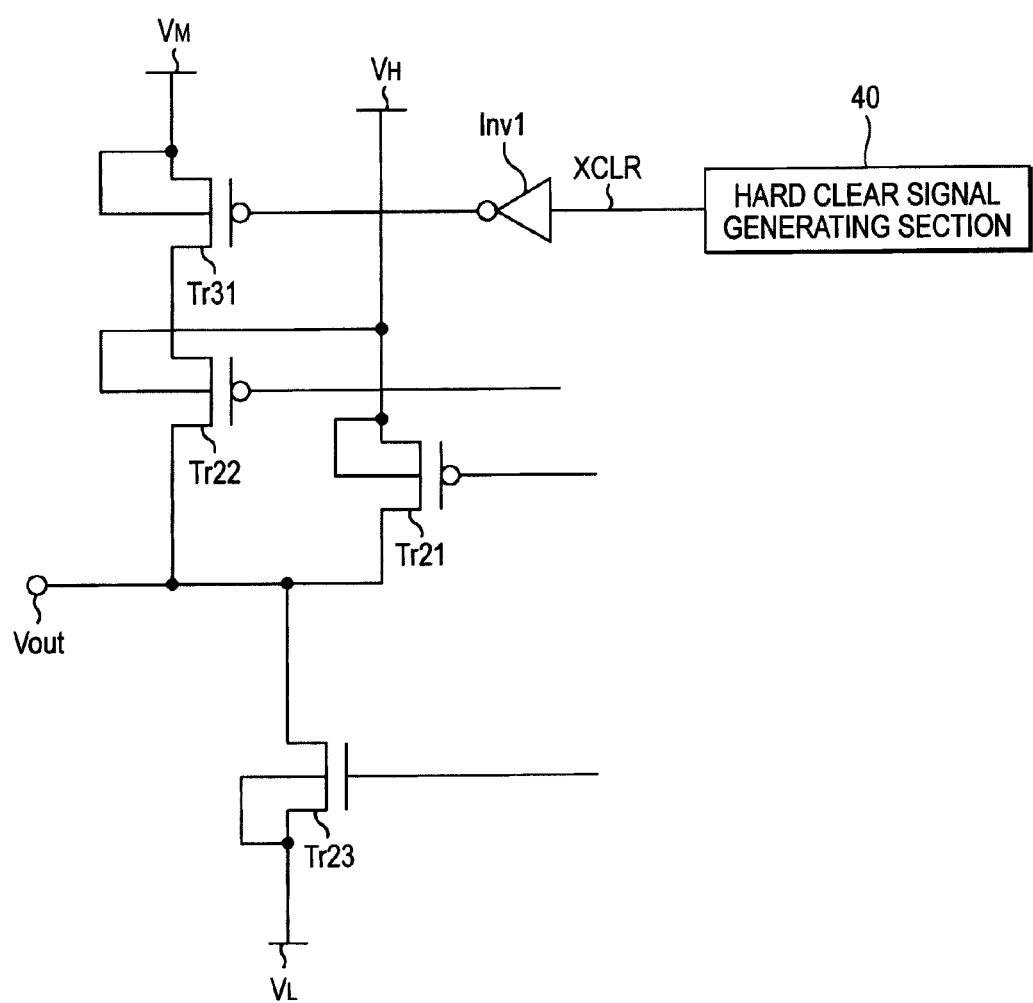
FIG. 3 is a block diagram illustrating an example of the configuration of the three-value output driver shown in FIG. 2.

It is possible to further provide a signal generating section (for example, a hard clear signal generating section 40 shown in FIG. 3) that generates a predetermined signal when supply of the power of the second power supply is stopped. In addition, it is possible to cause the fourth transistor to stop outputting the power of the first power supply to the source of the second transistor on the basis of the predetermined signal when supply of power of the second power supply is stopped.

Figure 6:
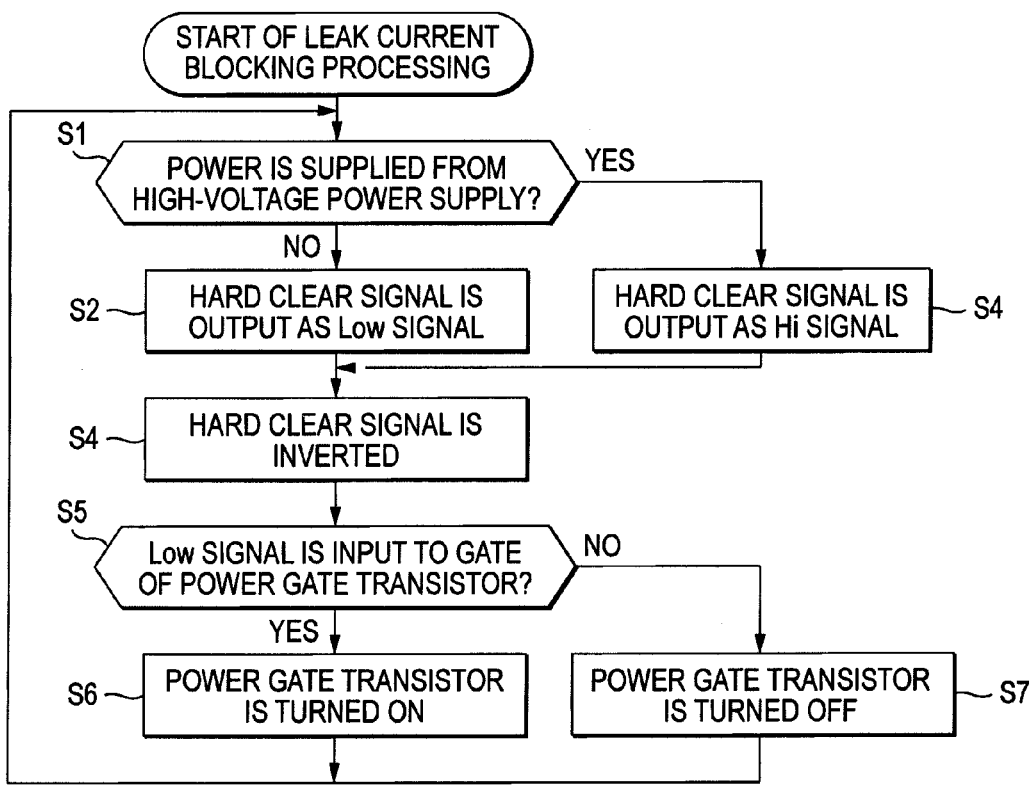
FIG. 6 is a flow chart explaining leakage current blocking processing.

According to another embodiment of the present invention, an operation method of a power supply device that switches one of a first power supply, a second power supply having a higher potential than the first power supply, and a third power supply having a lower voltage than the first voltage, all of which supply power to an auxiliary device, to a transfer gate in a CMOS image sensor having a photodiode and outputs the corresponding power to the transfer gate and that includes a first transistor that is driven by the second power supply and outputs power of the second power supply to the transfer gate, a second transistor that is driven by the second power supply and outputs power of the first power supply to the transfer gate, a third transistor that is driven by the third power supply and outputs power of the third power supply to the transfer gate, and a fourth transistor that is located before the second transistor, is driven by the first power supply, and outputs power of the first power supply to a source of the second transistor includes the step of causing the fourth transistor to stop outputting the power of the first power supply to the source of the second transistor when supply of the power of the second power supply is stopped (for example, step S7 in FIG. 6).

FIG. 2 is a view illustrating the configuration of an imaging apparatus according to an embodiment of the present invention.

The imaging apparatus shown in FIG. 2 includes an imaging unit 11 and an image processing unit 12. The imaging unit 11 configured to include a CMOS (complementary metal oxide semiconductor) sensor is controlled by the image processing unit 12 and the image processing unit 12 displays an image on the basis of an image signal imaged by the imaging unit 11.

The imaging unit 11 is configured to include a plurality of imaging elements 21 that image an image in the unit of a pixel, is controlled in the unit of a pixel by the image processing unit 12, and outputs to the image processing unit 12 an imaged image signal in the unit of a pixel. In addition, although only the configuration of one imaging element 21 is shown in FIG. 2, it is needless to say that the plurality of imaging elements 21 are provided in the imaging unit 11.

Referring to FIG. 2, a source of the transistor Tr11 is connected to a cathode of a photodiode PD, a drain of the transistor Tr11 is connected to a source of the transistor Tr12 and a gate of the transistor Tr13, and a gate of the transistor Tr11 is connected to a transfer signal line L3 through which a signal from the three-value output driver 39 is supplied. The transistor Tr11 transfers electric charges, which are generated by photoelectric conversion corresponding to the intensity of light received by the photodiode PD, to a floating diffusion region P1 (connection position between a drain of the transistor Tr11 and a source of the transistor Tr12 and connection position between the drain of the transistor Tr11 and the gate of the transistor Tr13) on the basis of a voltage supplied from the three-value output driver 39 through the transfer signal line L3. That is, the transistor Tr11 functions as a so-called transfer switch.

The source of the transistor Tr12 is connected to the floating diffusion region P1, a drain of the transistor Tr12 is connected to a power output line L1 of the high-voltage power $V_H$ output from the high-voltage power output section 32, and a gate of the transistor Tr12 is connected to a reset signal line L2 through which a reset signal from a reset signal output section 38 is supplied. The transistor Tr12 resets electric charges accumulated in the floating diffusion region P1 on the basis of the reset signal supplied from the reset signal output section 38 through the reset signal line L2. That is, the transistor Tr12 functions as a so-called reset switch.

A source of the transistor Tr13 is connected to the power output line L1 of the high-voltage power $V_H$ output from the high-voltage power output section 32, a drain of the transistor Tr13 is connected to a source of a transistor Tr14, and the gate of the transistor Tr13 is connected to the floating diffusion region P1. The transistor Tr13 is a source follower input MOS transistor and outputs electric charges accumulated in the floating diffusion region P1 through the transistor Tr14.

The source of the transistor Tr14 is connected to the drain of the transistor Tr13, a drain of the transistor Tr14 is connected to a signal output line L5, and a gate of the transistor Tr14 is connected to a selection signal line L4 supplied from a selecting section 45 of the image processing unit 12. The transistor Tr14 is turned on when the transistor Tr14 is selected on the basis of a selection signal supplied from the selecting section 45 through the selection signal line L4 and outputs a signal, which is supplied from the transistor Tr13, from the floating diffusion region P1 to the signal output line L5.

A power management section 31 of the image processing unit 12 makes an ON/OFF control of switches 35 to 37 provided in the high-voltage power output section 32, the intermediate-voltage power output section 33, and the low-voltage power output section 34, respectively, thereby managing outputs of the high-voltage power $V_H$ output from the high-voltage power output section 32, the intermediate-voltage power $V_M$ output from the intermediate-voltage power output section 33, and the low-voltage power $V_L$ output from the low-voltage power output section 34.

In a state before starting imaging, the reset signal output section 38 outputs a reset signal through the reset signal line L2 at timing when electric charges accumulated in each floating diffusion region P1 of the imaging element 21 are discharged.

The three-value output driver 39 is controlled by a driver control section 41 and the hard clear signal generating section 40. The three-value output driver 39 performs switching among the high-voltage power $V_H$ from the high-voltage power output section 32, the intermediate-voltage power $V_M$ from the intermediate-voltage power output section 33, and the low-voltage power $V_L$ from the low-voltage power output section 34, which are respectively supplied through the switches 35 to 37, according to an operation state and outputs the corresponding power to the transfer signal line L3.

The hard clear signal generating section 40 detects the high-voltage power $V_H$ of the high-voltage power output section 32 serving as a power supply of each imaging element 21 of the imaging unit 11. When the high-voltage power output section 32 is in a so-called non-running state without being raised up to the prescribed voltage $V_H$, the hard clear signal generating section 40 generates a hard clear signal as a Low signal and supplies the hard clear signal to the three-value output driver 39. In addition, when the high-voltage power output section 32 has started, a Hi signal indicating that a hard clear signal has started is output.

A signal processing section 42 is driven by the intermediate-voltage power $V_M$ supplied from the intermediate-voltage power output section 33 and acquires an image signal supplied from each imaging element 21, which is supplied through the signal output line L5, on the basis of a selection signal from the selecting section 45. Then, the signal processing section 42 generates one (for example, one frame) image signal and outputs the image signal to an image generating section 43. The image generation section 43 generates an image on the basis of the one image signal supplied from the signal processing section 42 and displays the image on a display section 44, such as an LCD (liquid crystal display).

Furthermore, in the case of the high-voltage power $V_H$, the intermediate-voltage power $V_M$, and the low-voltage power $V_L$, the high-voltage power $V_H$ may be 2.7 V, for example, as a power supply voltage of the imaging element 21, the intermediate-voltage power $V_M$ may be 1.8 V, for example, as a power supply voltage of an auxiliary device, and the low-voltage power $V_L$ may be −1 V, for example, as an open-circuit voltage. However, the high-voltage power $V_H$, the intermediate-voltage power $V_M$, and the low-voltage power $V_L$ satisfy the relationship of high-voltage power $V_H$>intermediate-voltage power $V_M$>low-voltage power $V_L$, and the above-mentioned voltages may not be necessarily set but other voltage combinations may also be applied as long as the "intermediate-voltage power $V_M$ of the transistor Tr11<Threshold voltage Vth (voltage allowing the source and the drain of the transistor Tr11 to be electrically conducted)" is satisfied.

Next, an example of the configuration of the three-value output driver 39 will be described with reference to FIG. 3.

A source of the p-type transistor Tr21 is connected to the high-voltage power output section 32 through the switch 35, a drain of the p-type transistor Tr21 is connected to an output terminal Vout, and a back gate of the p-type transistor Tr21 is connected to the high-voltage power output section 32. A signal input to the gate is switched to the high-voltage power $V_H$ or a voltage 0 by the driver control section 41. That is, the p-type transistor Tr21 functions as a switch of the high-voltage power supply $V_H$. In addition, the p-type transistor Tr21 is turned on when the voltage 0, which is a Low signal, is applied to the gate and is turned off when the voltage $V_H$, which is a Hi signal, is applied to the gate.

A source of the p-type transistor Tr22 is connected to a drain of the p-type transistor Tr31, a drain of the p-type transistor Tr22 is connected to the output terminal Vout, and a back gate of the p-type transistor Tr22 is connected to the high-voltage power output section 32. A signal input to the gate is switched to the high-voltage power $V_H$ or a voltage 0 by the driver control section 41.

The transistor Tr31 makes an ON/OFF control of the intermediate-voltage power supply $V_M$. When the transistor Tr31 is in an ON state, the p-type transistor Tr22 functions as a switch of the intermediate-voltage power supply $V_M$. In addition, the p-type transistor Tr22 is turned on when the voltage 0, which is a Low signal, is applied to the gate and is turned off when the voltage $V_H$, which is a Hi signal, is applied to the gate.

A source of the n-type transistor Tr23 is connected to the low-voltage power output section 34 through the switch 37, a drain of the n-type transistor Tr23 is connected to the output terminal Vout, and a back gate of the n-type transistor Tr23 is connected to the low-voltage power output section 34. A signal input to the gate is switched to the low-voltage power $V_L$ or a voltage 0 by the driver control section 41. That is, the n-type transistor Tr23 functions as a switch of the low-voltage power supply $V_L$. In addition, the n-type transistor Tr23 is turned on when the voltage $V_H$, which is a Hi signal, is applied to the gate and is turned off when the voltage 0, which is a Low signal, is applied to the gate.

A source of the p-type transistor Tr31 is connected to the intermediate-voltage power output section 33 through the switch 36, the drain of the p-type transistor Tr31 is connected to the source of the p-type transistor Tr22, and a back gate of the p-type transistor Tr31 is connected to the intermediate-voltage power output section 33. An inversion signal, which is inverted by an inverter Inv1, of a hard clear signal XCLR supplied from the hard clear signal generating section 40 is input to the gate. When the high-voltage power output section 32 is not running, the hard clear signal is a Low signal. Accordingly, the hard clear signal is inverted by the inverter Inv1 to thereby generate a Hi signal. In contrast, when the high-voltage power output section 32 is running, the hard clear signal is a Hi signal. Accordingly, the hard clear signal is inverted by the inverter Inv1 to thereby generate a Low signal.

The p-type transistor Tr31 makes an ON/OFF control of the intermediate-voltage power supply $V_M$ using the inversion signal of the hard clear signal supplied from the inverter Inv1. In the case when the switch 35 is turned off such that the high-voltage power output section 32 is not running and the hard clear signal is a Low signal, the p-type transistor Tr31 controls the intermediate-voltage power supply $V_M$ to be turned off since the inversion signal changes to a Hi signal. In the case when the high-voltage power output section 32 is running and the hard clear signal is a Hi signal, the p-type transistor Tr31 controls the intermediate-voltage power supply $V_M$ to be turned on since the inversion signal changes to a Low signal. Thus, since the p-type transistor Tr31 is a transistor that makes an ON/OFF control of the intermediate-voltage power supply $V_M$, the p-type transistor Tr31 is also referred to as a power gate transistor Tr31.

Next, an operation of the imaging apparatus shown in FIG. 2 will be described.

First, the power management section 31 controls the switches 35 to 37 to be turned on. Moreover, before starting an accumulation operation of the photodiode PD, the reset signal output section 38 generates a reset signal that is a Hi signal and supplies the reset signal through the reset signal line L2 to open the floating diffusion region P1 by the transistor Tr12. By this operation, the hard clear signal generating section 40 outputs a hard clear signal as a Hi signal and then a Low signal is output from the inverter Inv1, such that the transistor Tr31 is turned on.

Furthermore, the driver control section 41 supplies Low, Hi, and Low signals to the gates of the p-type transistors Tr21 and Tr22 and the n-type transistor Tr23 in the three-value output driver 39, respectively, so as to control only the p-type transistor Tr21 to be turned on. Thus, by applying the high-voltage power $V_H$ from the high-voltage power output section 32 to the gate of the transistor Tr11 serving as a transfer switch, the driver control section 41 turns on the transistor Tr11 and resets the photodiode PD.

Then, the driver control section 41 supplies Hi, Hi, and Hi signals to the gates of the p-type transistors Tr21 and Tr22 and the n-type transistor Tr23 in the three-value output driver 39, respectively, so as to control only the n-type transistor Tr23 to be turned on. Thus, by applying the low-voltage power $V_L$ from the low-voltage power output section 34 to the gate of the transistor Tr11 serving as a transfer switch, the driver control section 41 turns off the transistor Tr11 and accumulates electric charges generated by the photoelectric effect of the photodiode PD.

In this state, a selection signal indicating reading at the position of the imaging element 21 is supplied from the selecting section 45 to thereby turn on the transistor Tr14. Then, a voltage corresponding to a voltage of the floating diffusion region P1 is output to the signal output line L5 by a source follower obtained by a load connected to the transistor Tr13 and the selection signal line L4. The signal processing section 42 samples the output in a memory (not shown) corresponding to the read position. That is, the signal processing section 42 samples a reset noise.

Thereafter, the driver control section 41 supplies Low, Hi, and Low signals to the gates of the p-type transistors Tr21 and Tr22 and the n-type transistor Tr23 in the three-value output driver 39 so as to control the p-type transistors Tr21 and Tr22 and the n-type transistor Tr23 to be turned on, off, and off, respectively. Thus, by outputting the high-voltage power $V_H$ from the high-voltage power output section 32 to the gate of the transistor Tr11 serving as a transfer switch, the driver control section 41 turns on the transistor Tr11.

In addition, after a predetermined time has elapsed, the driver control section 41 supplies Hi, Low, and Low signals to the gates of the p-type transistors Tr21 and Tr22 and the n-type transistor Tr23 in the three-value output driver 39 so as to control the p-type transistors Tr21 and Tr22 and the n-type transistor Tr23 to be turned off, on, and off, respectively. Thus, by outputting the intermediate-voltage power $V_M$ from the intermediate-voltage power output section 33 to the gate of the transistor Tr11 serving as a transfer switch, the driver control section 41 turns on the transistor Tr11.

Then, finally, the driver control section 41 supplies Hi, Hi, and Hi signals to the gates of the p-type transistors Tr21 and Tr22 and the n-type transistor Tr23 in the three-value output driver 39 so as to control the p-type transistors Tr21 and Tr22 and the n-type transistor Tr23 to be turned off, off, and on, respectively. Thus, by applying the low-voltage power $V_L$ from the low-voltage power output section 34 to the gate of the transistor Tr11 serving as a transfer switch, the driver control section 41 turns off the transistor Tr11.

In this state, a selection signal indicating reading at the position of the imaging element 21 is supplied from the selecting section 45 to thereby turn on the transistors Tr13 and Tr14. Then, a voltage corresponding to a voltage of the floating diffusion region P1 is output to the signal output line L5. The signal processing section 42 samples the output in a memory (not shown) corresponding to the read position. That is, the signal processing section 42 samples "signal+reset noise generated by electric charges generated by the photoelectric effect".

To sum up, the photodiode PD is reset by turning on the transistor Tr11 with the high-voltage power $V_H$ and turning on the transistor Tr12 with a reset signal and then accumulation of electric charges performed by the photodiode PD is started by turning off the transistor Tr11 with the low-voltage power $V_L$. At this timing, only the "reset noise" of the floating diffusion region P1 is stored in the signal processing section 42 by turning on the transistors Tr13 and Tr14.

Then, after turning off the transistor Tr12, the transistor Tr11 is turned on by the high-voltage power $V_H$ and is further turned on by switching a voltage applied to the gate of the transistor Tr11 to the intermediate-voltage power $V_M$, and finally, the transistor Tr11 is turned off by the low-voltage power $V_L$, thereby transferring electric charges of the photodiode PD to the floating diffusion region P1. Then, by turning on the transistors Tr13 and Tr14, the "signal+reset noise generated by electric charges generated by photoelectric effect" of the floating diffusion region P1 are stored in the signal processing section 42.

More specifically, a voltage of the floating diffusion region P1 changes to a voltage VP1 (=Vres−Q/CP1) which has decreased from a voltage Vres immediately after resetting by Q/CP1 (transferred electric charges Q and CP1 are the capacity of the floating diffusion region P1). That is, Q/CP1 is superimposed on a reset voltage including a reset noise different for every resetting. Since a signal corresponding to the voltage is output to the signal output line L5, the signal processing section 42 sequentially samples the signal.

Finally, the signal processing section 42 eliminates a reset noise, which is reset to a voltage different for every resetting by calculating a difference between the "reset noise" and the "signal+reset noise generated by electric charges generated by photoelectric effect". As a result, it is possible to acquire a "signal generated by electric charges generated by the photoelectric effect" not including a noise.

Particularly by adopting a photodiode embedded as the photodiode PD, a reset noise can be completely eliminated. As a result, a high S/N ratio can be obtained.

Here, it will be described why the voltage applied to the gate of the transistor Tr11 is set to three values of the high-voltage power $V_H$, the intermediate-voltage power $V_M$, and the low-voltage power $V_L$ in the above-described operation.

In recent years, the small pixel size is realized by using a fine MOS transistor in the imaging element 21. For this reason, an afterimage and a random noise has often occurred due to a new cause resulting from the fine MOS transistor.

Figure 4:
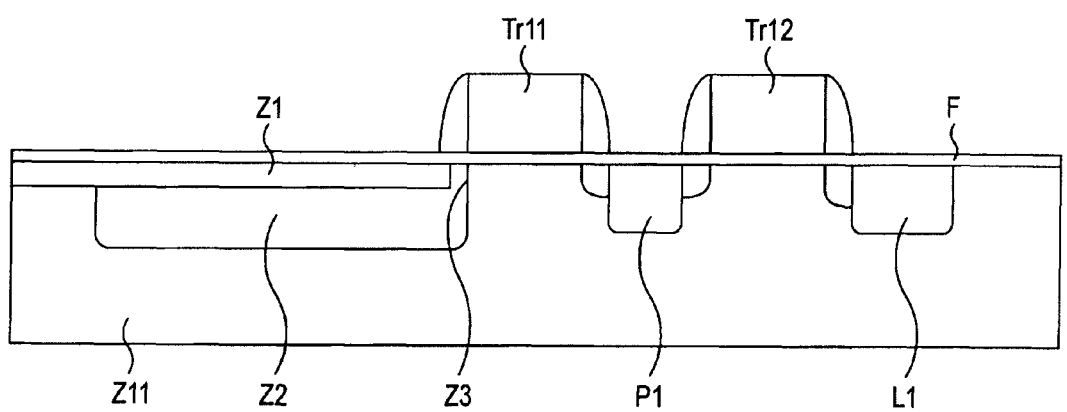
FIG. 4 is a side sectional view illustrating an example of the configuration of an imaging element shown in FIG. 2.

For example, as shown by FIG. 4, a region Z1 serving as a surface p region is provided on a region Z2 serving as an n region of a photodiode (photodiode having such structure is particularly called an embedded photodiode) and electric charges, which are accumulated in the region Z2 serving as the n region by a depletion layer extending from the region Z1 serving as the surface p region and a region Z11 serving as a PWL (P well), are transferred to the floating diffusion region P1 through the transistor Tr11. The floating diffusion region P1 is connected through the transistor Tr12 so as to be set to a predetermined reset potential.

Figure 5:
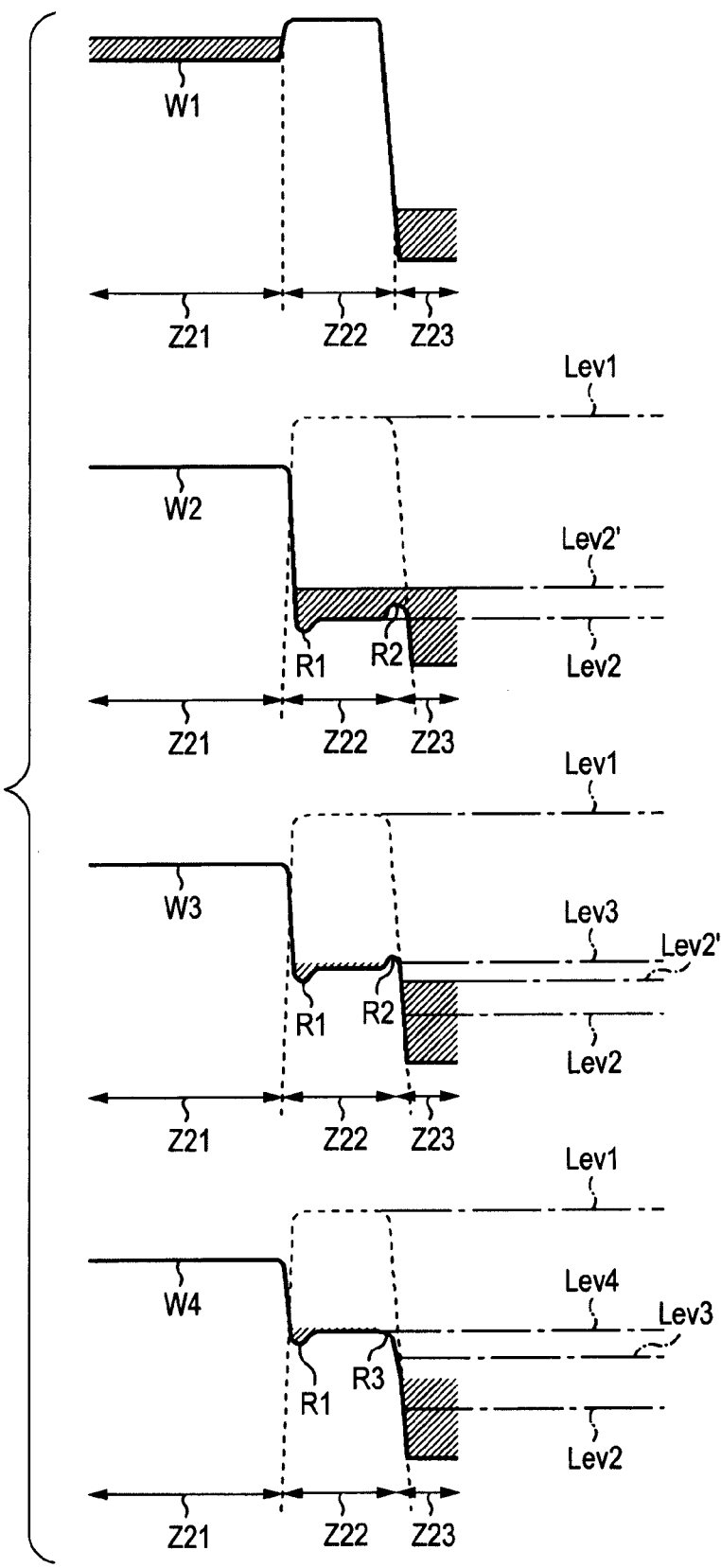
FIG. 5 is a view illustrating the potential distribution in every region in the side sectional view shown in FIG. 4.

In the imaging element 21 using a fine MOS transistor, for example, a potential pocket R1 or a barrier R2 is generated in a range Z22 of the gate of the transistor Tr11, which is shown by a waveform W2 or W3 in FIG. 5. As a result, some electric charges present in a region of the transistor Tr11 return to the photodiode PD, which often generates an afterimage or a random noise. In addition, in FIG. 5, a potential corresponding to each of a range Z21 corresponding to the region Z1 of the photodiode PD shown in FIG. 4, the range Z22 corresponding to the region Tr11 of the gate of the transistor Tr11 shown in FIG. 4, and a range Z23 corresponding to the floating diffusion region P1 shown in FIG. 4 in each operation state is expressed by the height in the vertical direction in the drawing, and a portion expressed by an oblique line indicates a potential caused by the transferred electric charges.

That is, in manufacturing the fine MOS transistor, diffusion of impurities (for example, boron or phosphorus) that determine the conduction type is not caused by simple heating but is largely affected by a transient accelerating diffusion phenomenon (for example, diffusion with defect) due to heat treatment in a low temperature and a short period of time in a manufacturing process. As a result, boron that determines a p-type well region is segregated in a range corresponding to a right end portion of the range Z22 in the drawing, such that the barrier R2 shown by the waveforms W2 and W3 is formed. Such a phenomenon is known as a reverse short channel effect in a fine MOS transistor.

On the other hand, a region corresponding to a left end portion of the range Z22 in the drawing, that is, a place (portion to which the ranges Z21 and Z22 are connected) connected to the gate of the transistor Tr11 from the region Z2 serving as an n region of a photodiode is a place that determines the transfer characteristic of a signal charge. Here, the positional relationship between the region Z1 of the surface p region of the photodiode PD and the region Z2 serving as an n region is very important. Particularly in the case of using a fine MOS transistor, a voltage applied to the gate of the transistor Tr11 should be set low. As a result, since the potential when turning on a transfer switch cannot be sufficiently held down, it becomes difficult to transfer electric charges. Depending on a case, a region Z3 as a bypass region that is of an N type may be provided positively in order to urge the transfer of electric charges, as shown in FIG. 4.

The width of the bypass region Z3 is approximately 0 to 0.5 μm, for example. When the width is too small, the transfer becomes difficult. In addition, when the width is too large, the potential pocket R1 in the waveforms W2 to W4, for example, is generated. In the case when the voltage applied to the gate of the transistor Tr11 is high, the transfer can be compensated with the voltage. Accordingly, it is possible to set a design value such that the potential pocket R1 cannot be generated. However, in the case of using a fine MOS transistor, the transfer cannot be compensated by a voltage. Accordingly, since the width is controlled only by 0.05 μm or less, a severer condition than the controllability of the gate length of the fine MOS transistor is requested. As a result, the potential pocket R1 is easily generated.

Here, when Hi of a gate voltage of the transistor Tr11=high-voltage power $V_H$, a threshold voltage of the transistor Tr11=Vth, and a voltage of the floating diffusion region P1=VP1 are used, the residual electric charges have a relationship of residual electric charges ∝ ($V_H$–Vth–VP1).

An afterimage is generated since some or all of the residual electric charges return to the photodiode PD. In addition, depending on an operation condition, the residual electric charges are also generated when it is dark and the residual electric charges return to the photodiode PD. As a result, since the residual electric charges shake thermally, a random noise is generated.

In FIG. 4, the region Z1 is a surface p region of the photodiode PD, and the region Z2 is an n region of the photodiode PD, the region Z3 is a bypass region, the region Tr11 is a region below the gate of the transistor Tr11, the region Tr12 is a region below the gate of the transistor Tr12, the region P1 is the floating diffusion region P1, the region L1 is a region of the power output line L1, and the region Z11 is a P well region.

Such an operation will be described below according to a potential change.

That is, when the reset signal output section 38 generates a reset signal to rest the floating diffusion region P1, the potential distribution shown by the waveform W1 in FIG. 5 is obtained. At this time, the potential of the range Z22 corresponding to the region Tr11 of the gate of the transistor Tr11 becomes a Lev1 in the drawing by the high-voltage power $V_H$. In the waveform W1 shown in FIG. 5, the potential Lev1 in the range Z22 becomes a barrier, such that electric charges generated in the photodiode PD by the photoelectric effect are accumulated in the range Z21 corresponding to the region Z2 of the photodiode PD. In addition, the electric charges of the range Z23 (floating diffusion region P1) in the waveform W1 of FIG. 5 are electric charges accumulated by reset noises. In FIG. 5, a portion expressed by an oblique line indicates the potential of electric charges.

Then, when the three-value output driver 39 outputs the high-voltage power $V_H$ in this state to thereby turn on the transistor Tr11 serving as a transfer switch, the potential of the range Z22 is reduced to become the Lev2 as shown by the waveform W2 in FIG. 5. Then, the electric charges, which are generated by the photoelectric effect of the photodiode PD, accumulated in the range Z21 are transferred and the electric charges flow to the range Z23 that is the floating diffusion region P1. At this time, depending on the amount of electric charges transferred, the potential Lev2 of the range Z22 positioned below the gate of the transistor Tr11 becomes lower than that of the range Z23 of the floating diffusion region P1. Accordingly, the potential in the range Z22 also increases to a potential Lev2' by the electric charges.

For example, in the case of setting the low-voltage power $V_L$ such that the potential becomes Lev3 higher than Lev2' in consideration of a potential increasing by electric charges and controlling the gate of the transistor Tr11 in two values, the movement of electric charges is stopped when the low-voltage power $V_L$ is applied to the gate of the transistor Tr11, as shown by the wavelength W3 in FIG. 5. Then, since residual electric charges remaining in the range Z22 corresponding to the region Tr11 of the gate of the transistor Tr11 also return to the photodiode PD, an afterimage or a random noise is generated.

For this reason, by setting a voltage applied to the gate of the transistor Tr11 to the intermediate-voltage power $V_M$ (here, the intermediate-voltage power $V_M$ is smaller than the threshold voltage Vth of the gate of the transistor Tr11), which is an intermediate voltage between the high-voltage power $V_H$ and the low-voltage power $V_L$, the transistor Tr11 is turned on between the source and the drain and a potential Lev4 higher than the potential Lev3 is maintained (state higher than the Fermi level of a carrier is maintained), as shown by the waveform W4 in FIG. 5. Then, a state R3 in which the barrier R2 serving as a right end portion in the drawing is almost removed is obtained. By reducing residual electric charges below the gate of the transistor Tr11 serving as a transfer switch by maintaining such a state for a predetermined time, the electric charges can be discharged to the floating diffusion region P1.

Thus, in order to control a noise by reducing residual electric charges, which remain without being transferred, of the electric charges generated by the photodiode PD, the three-value output driver 39 controls a gate voltage of the transistor Tr11 in three values by setting the intermediate-voltage power $V_M$ in addition to the high-voltage power $V_H$ and the low-voltage power $V_L$.

Next, the power management of the high-voltage power $V_H$ output from the high-voltage power output section 32, the intermediate-voltage power $V_M$ output from the intermediate-voltage power output section 33, and the low-voltage power $V_L$ output from the low-voltage power output section 34 will be described.

The high-voltage power output section 32 and the low-voltage power output section 34 function as the high-voltage power supply $V_H$ and the low-voltage power supply $V_L$ that supply a Hi signal and a Low signal applied to the gate of the transistor Tr11, respectively, and are set as exclusive power supplies of the imaging element 21. Accordingly, the power management section 31 controls the switches 35 and 37 to be turned on when the imaging unit 11 having the imaging element 21 runs. In addition, the power management section 31 controls the switches 35 and 37 to be turned off when the imaging unit 11 is not used.

The intermediate-voltage power output section 33 functions as the intermediate-voltage power $V_M$ that is an intermediate voltage applied to the gate of the transistor Tr11 as described above and at the same time, functions as a power supply that supplies power to various kinds of auxiliary devices represented by the signal processing section 42. Accordingly, the power management section 31 controls the switch 36 to be turned on when the auxiliary device operates as well as when the imaging unit 11 having the imaging element 21 runs. In addition, the power management section 31 controls the switch 36 to be turned off when operations of the imaging unit 11 and the auxiliary device are stopped.

Thus, although the high-voltage power output section 32 and the low-voltage power output section 34 may be turned off in a state where the imaging element 21 of the imaging unit 11 does not operate, one of the auxiliary devices operates continuously in many cases. Accordingly, it is considered that only the intermediate-voltage power $V_M$ supplied from the intermediate-voltage power output section 33 runs. When only the intermediate-voltage power supply $V_M$ runs, a hard clear signal that is a Low signal is generated by the hard clear signal generating section 40. On the basis of the hard clear signal that is the Low signal, the inverter Inv1 in the three-value output driver 39 generates a Hi signal as an inversion signal of the hard clear signal and the inversion signal, which is the Hi signal, is input to the gate of the transistor Tr31. Then, the transistor Tr31 is turned off, and accordingly, application of the intermediate-voltage power $V_M$ to the source of the transistor Tr22 is blocked due to the transistor Tr31.

As a result, since the intermediate-voltage power $V_M$ in a running state is not applied to the source of the transistor Tr22 in a state where the high-voltage power $V_H$ is not applied to the back gate of the transistor Tr22 by the processing described above, a leakage current from the source to the back gate is not generated in the transistor Tr22.

Here, referring to a flow chart shown in FIG. 6, a leakage current blocking processing in the three-value output driver 39 that blocks generation of the above-described leakage current will be described in more detail.

In step S1, the hard clear signal generating section 40 determines whether or not power of the high-voltage power supply $V_H$ is supplied on the basis of ON of the switch 35 of the high-voltage power output section 32. For example, in the case when there is no power supply of the high-voltage power $V_H$ from the high-voltage power output section 32 since an operation of the imaging unit 11 is stopped and the switch 35 is turned off, for example, in a low power mode by the power management section 31, the hard clear signal generating section 40 generates the hard clear signal XCLR, which is a Low signal, indicating hard clear and supplies the generated hard clear signal XCLR to the inverter Inv1 of the three-value output driver 39 in step S2.

On the other hand, in the case when there is power supply of the high-voltage power $V_H$ from the high-voltage power output section 32 since imaging using the imaging unit 11 is instructed and the switch 35 is turned on by the power management section 31 in step S1, the hard clear signal generating section 40 generates the hard clear signal XCLR, which is a Hi signal, not indicating hard clear and supplies the generated hard clear signal XCLR to the inverter Inv1 of the three-value output driver 39 in step S3.

In step S4, the inverter Inv1 inverts the hard clear signal XCLR supplied from the hard clear signal generating section 40 and outputs the hard clear signal XCLR to the gate of the transistor Tr31. That is, the inverter Inv1 outputs a Hi signal when the hard clear signal XCLR is a Low signal. In contrast, the inverter Inv1 outputs a Low signal when the hard clear signal XCLR is a Hi signal.

In step S5, the transistor Tr31 determines whether or not a signal supplied from the inverter Inv1 to the gate thereof is a Low signal, that is, whether or not the hard clear signal XCLR not indicating the hard clear is supplied from the hard clear signal generating section 40. For example, in the case when the signal supplied from the inverter Inv1 is a Low signal such that power of the high-voltage power supply $V_H$ is supplied without instruction of hard clear, the transistor Tr31 is controlled to be turned on. Then, the intermediate-voltage power $V_M$, which is supplied from the intermediate-voltage power output section 33, supplied to the source of the transistor Tr31 is output from the drain to be then supplied to the source of the transistor Tr22. Then, the processing returns to step S1.

On the other hand, for example, in the case when the signal supplied from the inverter Inv1 to the gate of the transistor Tr31 is a Hi signal such that hard clear is instructed and power of the high-voltage power supply $V_H$ is not supplied in step S5, the transistor Tr31 is controlled to be turned off. Then, the intermediate-voltage power $V_M$, which is supplied from the intermediate-voltage power output section 33 to the gate, is not supplied from the drain to the source of the transistor Tr22. Then, the processing returns to step S1.

As described above, by providing the transistor (power gate transistor) Tr31 before the transistor Tr22, the switches 35 to 37 are turned off to stop the operation of the imaging unit 11 and to operate only the signal processing section 42, for example. Then, since the switch 36 is turned on in a state where the output of the high-voltage power $V_H$ from the high-voltage power output section 32 is stopped, the intermediate-voltage power $V_M$ is output from the intermediate-voltage power output section 33. In the case when supply of power to the signal processing section 42 continues, the transistor Tr31 is controlled to be turned off. Then, with respect to the back gate of the transistor Tr22, the intermediate-voltage power $V_M$ to the source is not applied in a state where the high-voltage power $V_H=0$ is applied. As a result, a leakage current between the source and the gate of the transistor Tr22 is blocked. In addition, since a leakage current does not need to be considered, it becomes not necessary run the high-voltage power $V_H$ although only the intermediate-voltage power $V_M$ is used to prevent the leakage current. As a result, it becomes possible to reduce the power consumption. In addition, since it becomes not necessary to run the intermediate-voltage power $V_M$ after first running the high-voltage power $V_H$, there may be a variation in a starting sequence.

In addition, although the signal processing section 42 is mentioned as an auxiliary device in the above description, it is needless to say that other devices may also be used as long as the other devices operate by the intermediate-voltage power $V_M$.

Furthermore, although an example of controlling the transfer gate of the imaging element 21 in three values has been described above, a control may be made in a state of a plurality of voltages by using a power supply having voltage values more than the three values. In this case, the same effects may be obtained by providing the same configuration as the transistor Tr31 with respect to a voltage serving as each intermediate potential.

According to the embodiment of the present invention, it becomes possible to efficiently reduce the power consumption of a plurality of power supplies with different voltages and to set the starting sequence freely.

Moreover, in this specification, the steps describing the flow chart include not only processing performed in a time-sequential manner according to the described order but also processing performed in parallel or separately even if not necessarily performed in the time-sequential manner.

Figure 7:
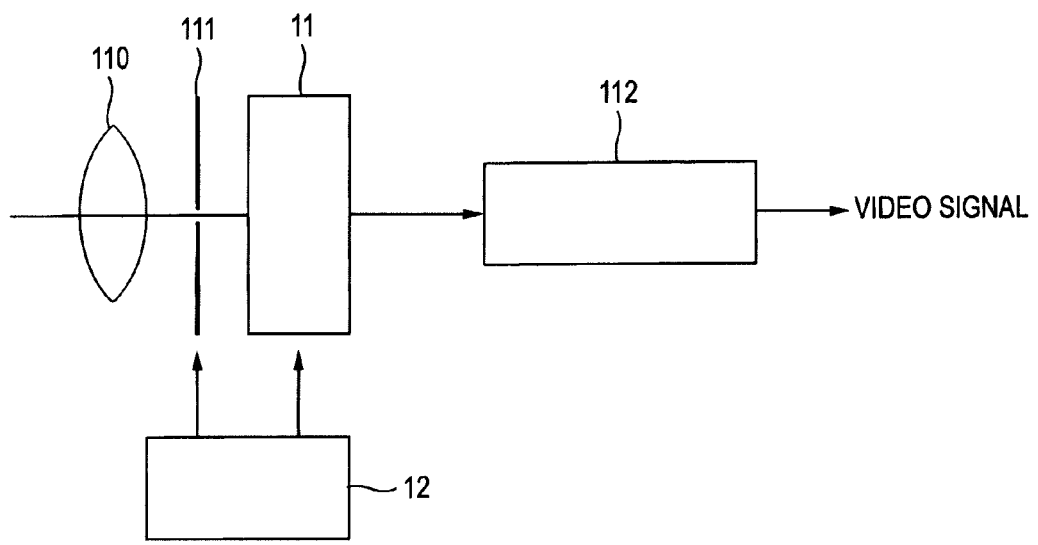
FIG. 7 is a block diagram illustrating a camera according to an embodiment of the present invention.

FIG. 7 is a cross-sectional view illustrating a camera according to each embodiment of the present invention. The camera according to the present embodiment is an example of a video camera capable of photographing a still image or a moving image.

The camera according to the present embodiment includes the image sensor 11, an optical system 110, a shutter device 111, an image processing unit 12, and a signal processing circuit 112.

The optical system 110 makes image light (incident light) from a subject body imaged on an imaging surface of the image sensor 11. As a result, corresponding signal charges are accumulated within the image sensor 11 for a predetermined period.

The shutter device 111 controls a light irradiation period and a light blocking period with respect to the image sensor 11.

The image processing unit 12 supplies a driving signal for controlling a transfer operation of the image sensor 11 and a shutter operation of the shutter device 111. Signal transfer of the image sensor 11 is performed by the driving signal (timing signal) supplied from the image processing unit 12. The signal processing circuit 112 performs various kinds of signal processing. A video signal subjected to signal processing is stored in a storage medium, such as a memory, or output to a monitor.

In the above embodiment, the case where the present invention is applied to the image sensor 11, in which unit pixels that detect signal charges corresponding to the light amount of visible light as a physical amount are arrayed in a matrix, has been described as an example. However, the present invention is not limited to being applied to the image sensor 11 but may also be applied to all kinds of column type solid-state imaging devices in which a column circuit is disposed for every pixel column of a pixel array section.

Furthermore, the present invention is not limited to being applied to a solid-state imaging device that detects the distribution of incident light amount of visible light and images the distribution as an image but may also be applied to a solid-state imaging device that images infrared rays or X rays or the distribution of incident amount of particles and the like as an image or in a broader meaning, to all kinds of solid-state imaging devices (physical amount distribution detecting devices), such as a fingerprint detecting sensor, which detect the distribution of another physical amount, such as pressure or electrostatic capacitance, and images the distribution as an image.

Furthermore, the present invention is not limited to being applied to a solid-state imaging device that sequentially scans unit pixels of a pixel array section in the unit of a row and reads a pixel signal from each of the unit pixels but may also be applied to an X-Y address type solid-state imaging device that selects an arbitrary pixel in the unit of a pixel and reads a signal from the selected pixel in the unit of a pixel.

Furthermore, a solid-state imaging device may be formed in the form of one chip or may be formed in the form of a module having an imaging function in a state where an imaging section and a signal processing section or an optical system are packaged in groups.

In addition, the present invention is not limited to being applied to solid-state imaging devices but may also be applied to imaging apparatuses. Here, the imaging apparatuses refer to a camera system, such as a digital camera or a video camera, or an electronic apparatus having an imaging function, such as a mobile phone. In addition, the form of a module mounted in an electronic apparatus, that is, a camera module may be an imaging apparatus.

By using the image sensor 11 according to the above-described embodiment as a solid-state imaging device in a video camera or a digital camera or an imaging apparatus, such as a camera module for a mobile apparatus such as a mobile phone, it is possible to obtain a high-quality image with a simple configuration in the image sensor 11.

It should be understood by those skilled in the art that various modifications, combinations, sub-combinations and alterations may occur depending on design requirements and other factors insofar as they are within the scope of the appended claims or the equivalents thereof.

What is claimed is:

1. A method of controlling a power supply device for a solid state imaging device, the power supply having circuitry that switches one of a first power supply, a second power supply having a higher potential than the first power supply, and a third power supply having a lower voltage than the first power supply, all of which supply power to an auxiliary device, to a transfer gate in a CMOS image sensor having a photodiode and outputs the corresponding power to the transfer gate, the method comprising:
    applying an output from a second power supply to the transfer gate via a first transistor;
    applying an output from a first power supply to the transfer gate via a second transistor;
    applying an output from a third power supply to the transfer gate via a third transistor; and
    performing leakage current blocking processing via a fourth transistor, wherein the fourth transistor stops outputting the power of the first power supply to the source of the second transistor when supply of the power of the second power supply is stopped.

2. The power supply device according to claim 1, further comprising:
    a signal generating section generating a predetermined signal when supply of the power of the second power supply is stopped,
    wherein the fourth transistor stops outputting the power of the first power supply to the source of the second transistor on the basis of the predetermined signal when supply of the power of the second power supply is stopped.

* * * * *